(12) United States Patent
Takamatsu et al.

(10) Patent No.: US 7,772,692 B2
(45) Date of Patent: Aug. 10, 2010

(54) SEMICONDUCTOR DEVICE WITH COOLING MEMBER

(75) Inventors: Tomonao Takamatsu, Tokyo (JP);
Hideo Aoki, Kanagawa-ken (JP);
Kazunari Ishimaru, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 11/892,808

(22) Filed: Aug. 27, 2007

(65) Prior Publication Data

US 2008/0067673 A1 Mar. 20, 2008

(30) Foreign Application Priority Data

Aug. 29, 2006 (JP) .............................. 2006-232747

(51) Int. Cl.
*H01L 23/34* (2006.01)
*H01L 23/26* (2006.01)
(52) U.S. Cl. .............................. 257/722; 257/E23.026; 174/16.3; 165/803
(58) Field of Classification Search ................. 257/731, 257/E23.026; 174/163; 165/803
See application file for complete search history.

(56) References Cited

U.S. PATENT DOCUMENTS 5,455,382 A * 10/1995 Kojima et al. ............... 174/16.3
6,721,341 B2 * 4/2004 Aikiyo et al. ................. 372/36
2004/0042171 A1 3/2004 Takamatsu et al.

FOREIGN PATENT DOCUMENTS

JP 2000-164777 A 6/2000
JP 2004-296726 A 10/2004
JP 2005-057088 A 3/2005

* cited by examiner

*Primary Examiner*—Howard Weiss
*Assistant Examiner*—Steven H Rao
(74) *Attorney, Agent, or Firm*—Foley & Lardner LLP

(57) ABSTRACT

A semiconductor device comprises: a semiconductor element; a mounting substrate with the semiconductor element mounted thereon; a first high thermal conductivity member formed on a surface of the mounting substrate; and a first cooling member thermally connected to at least a part of the first high thermal conductivity member. The first high thermal conductivity member is thermally connected to the semiconductor element, and the first high thermal conductivity member has an outer edge which is located outside an outer edge of the semiconductor element.

21 Claims, 7 Drawing Sheets

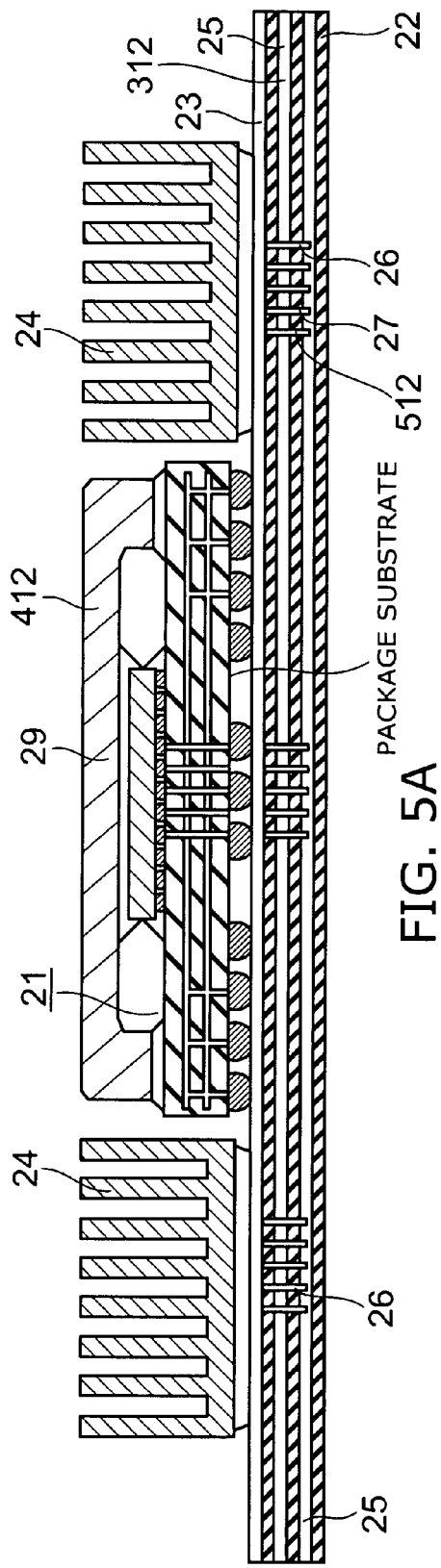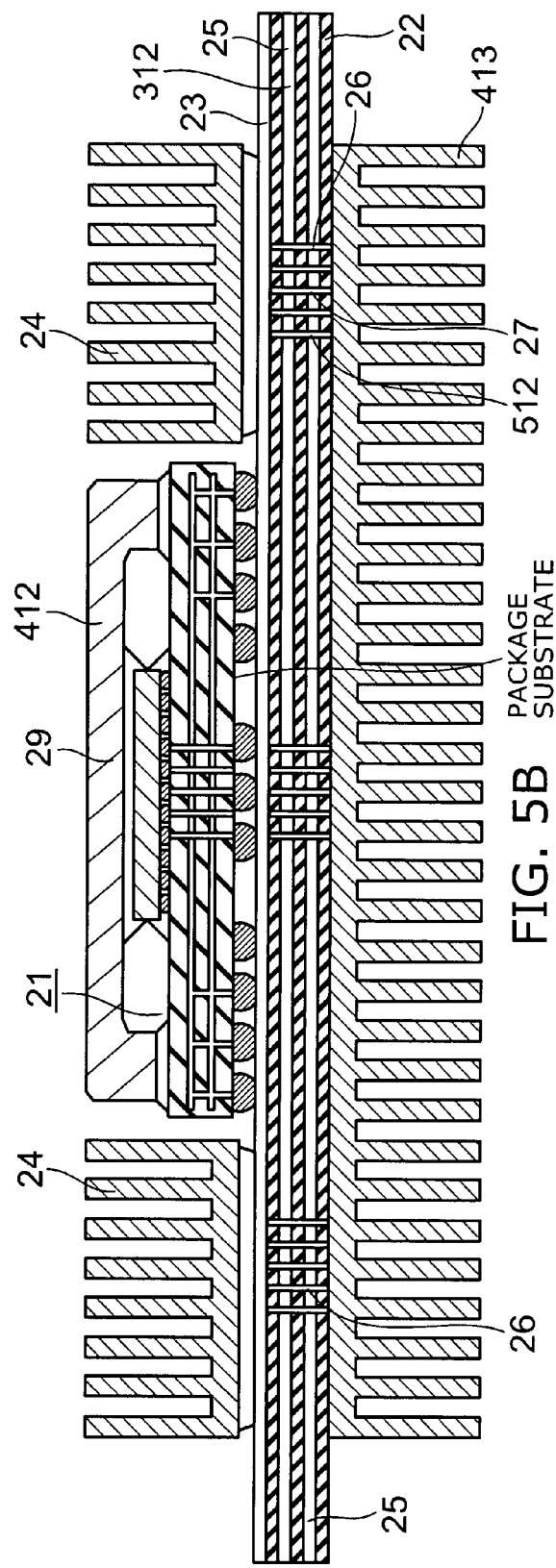
FIG. 5A
FIG. 5B

SEMICONDUCTOR DEVICE WITH COOLING MEMBER

CROSS-REFERENCE TO RELATED APPLICATIONS

This application is based upon and claims the benefit of priority from the prior Japanese Patent Application No. 2006-232747, filed on Aug. 29, 2006; the entire contents of which are incorporated herein by reference.

BACKGROUND OF THE INVENTION

1. Field of the Invention

This invention relates to a method for cooling a semiconductor device.

2. Background Art

A semiconductor element constituting a semiconductor device runs away at increased temperature. Hence the semiconductor element is controlled to less than a prescribed temperature for safe operation. In particular, a highly heat-generating semiconductor chip dissipates heat with a heat spreader (heat spreading plate), a heat sink (heat radiating plate), and/or a fan. For example, the upper face of the semiconductor element is covered with a heat spreader, and a heat sink is further mounted thereon to improve heat dissipation characteristics. Some products use water cooling techniques.

In any cooling techniques, cooling is performed by thermally connecting a heat receiving portion to the upper face of the semiconductor element. However, small electronic devices such as mobile phones are slimmed down, leaving insufficient space above the semiconductor element. Consequently, it is expected that cooling becomes difficult.

As a conventional technique, JP 2000-164777A discloses a semiconductor device with a heat radiating plate made of graphite fibers arranged in the planar direction and extending in the plate thickness direction, thereby allowing reduction of thermal resistance. A heat spreading member made of copper plate is laminated on the entire surface of the heat radiating plate made of graphite fibers arranged in the planar direction and extending in the plate thickness direction. A semiconductor chip is die-bonded at the upper side center of the heat spreading member, and external terminals are held with ceramic material at the upper edge of the heat spreading member. The heat spreading member is electrically insulated from the external terminals by the ceramic material, and the semiconductor chip is electrically connected to the external terminals by bonding wires. In this case, the thickness of the semiconductor device increases, as the semiconductor chip and the heat radiating plate are stacked.

SUMMARY OF THE INVENTION

According to an aspect of the invention, there is provided a semiconductor device including: a semiconductor element; a mounting substrate with the semiconductor element mounted thereon; and a high thermal conductivity member formed on a surface of the mounting substrate or on the surface of and inside the mounting substrate, heat being spread from a junction between the semiconductor element and the mounting substrate to the surface or inside of the mounting substrate in a planar direction, a portion of the high thermal conductivity member or a member thermally connected to the high thermal conductivity member being exposed on the surface of the mounting substrate, and a cooling member being thermally connected to the exposed portion of the high thermal conductivity member or the exposed member thermally connected to the high thermal conductivity member.

According to an aspect of the invention, there is provided a semiconductor device including: a semiconductor element; a mounting substrate with the semiconductor element mounted thereon; a first high thermal conductivity member formed on a surface of the mounting substrate, the first high thermal conductivity member being thermally connected to the semiconductor element, and having an outer edge which is located outside an outer edge of the semiconductor element; and a first cooling member thermally connected to at least a part of the first high thermal conductivity member.

BRIEF DESCRIPTION OF THE DRAWINGS

FIG. 5A is a cross-sectional view of a semiconductor device according to the second embodiment which is one of embodiments of the present invention.

FIG. 5B is a cross-sectional view of a semiconductor device showing another example semiconductor device of the second embodiment.

DETAILED DESCRIPTION OF THE INVENTION

Embodiments of the invention will now be described in the following.

First Embodiment

A first embodiment is described with reference to FIGS. 1 to 4.

Figure 1:
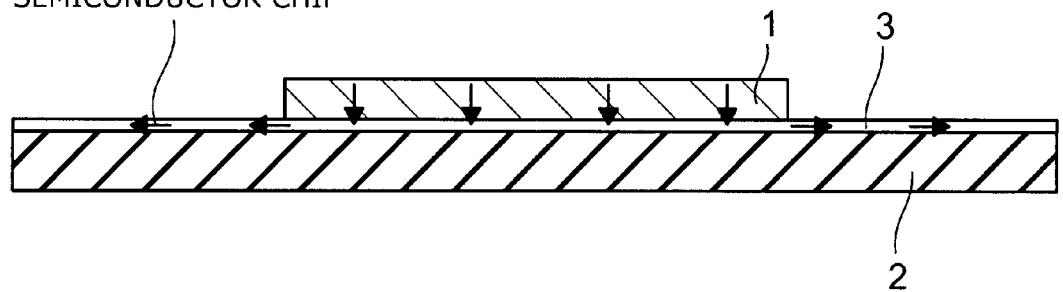
FIG. 1 is a cross-sectional view of a mounting substrate with a semiconductor element mounted thereon, illustrating propagation of heat from the semiconductor element according to the first embodiment which is one of embodiments of the present invention.
Figure 2A:
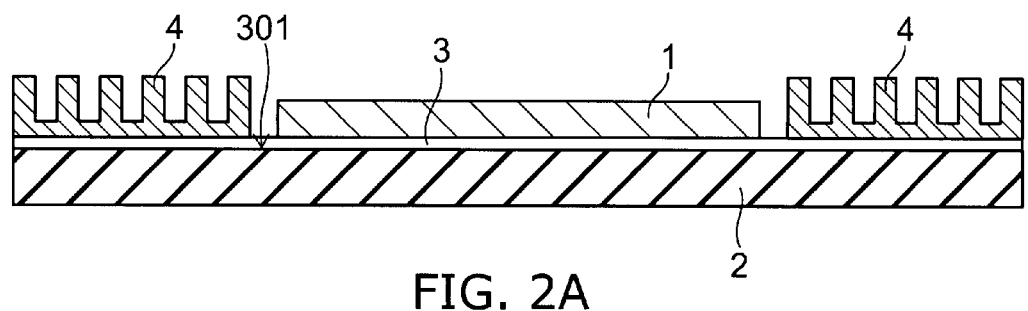
FIG. 2A is a cross-sectional view of a semiconductor device according to the first embodiment.
Figure 3:
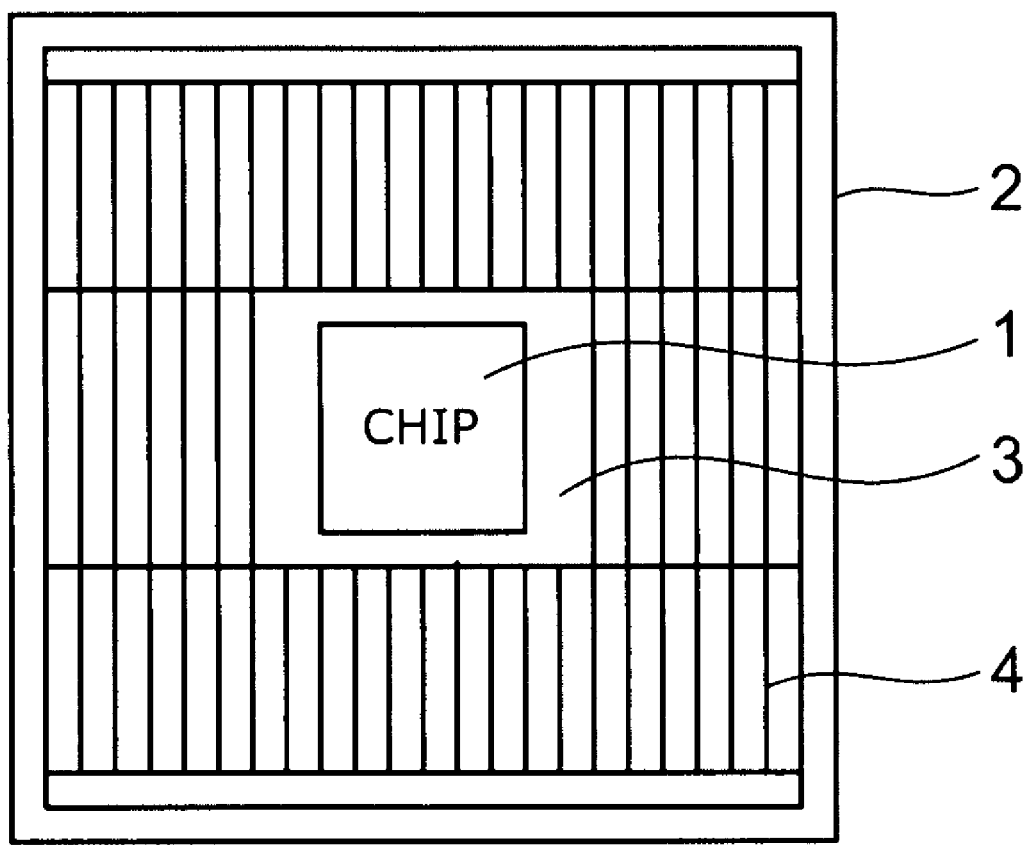
FIG. 3 is a plan view of the semiconductor device shown in FIG. 2.
Figure 4:
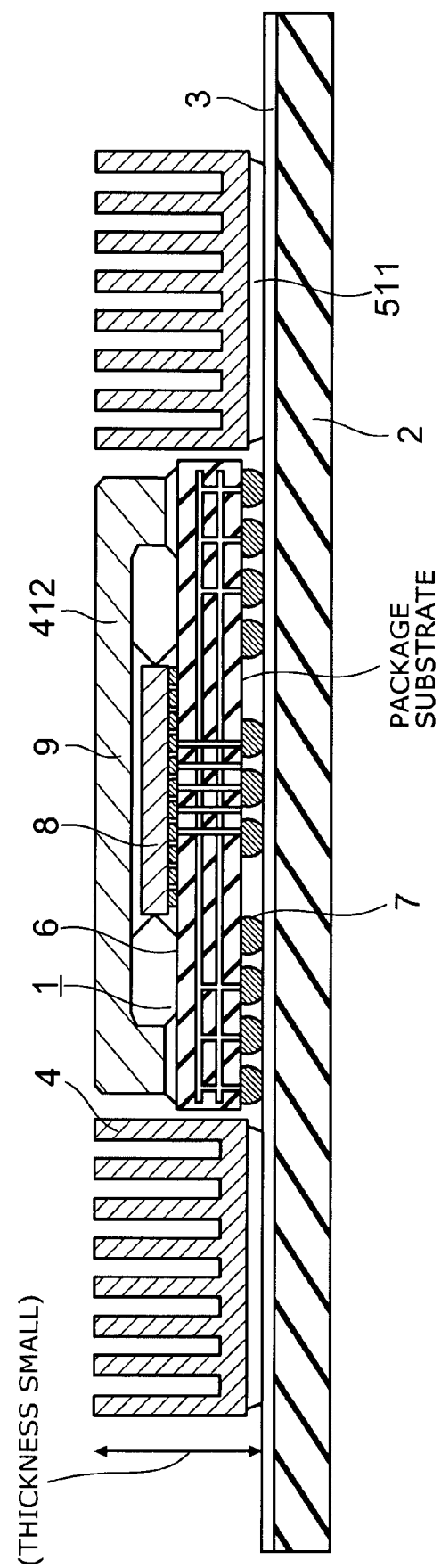
FIG. 4 is a cross-sectional view of a semiconductor device showing another example semiconductor device of the first embodiment.

FIG. 1 is a cross-sectional view of a mounting substrate with a semiconductor element mounted thereon, illustrating propagation of heat from the semiconductor element. FIG. 2A is a cross-sectional view of a semiconductor device according to this embodiment. FIG. 3 is a plan view of the semiconductor device shown in FIG. 2A. FIG. 4 is a cross-sectional view of another example semiconductor device of this embodiment. As shown in FIG. 2A, the semiconductor device comprises a mounting substrate 2, at least one packaged semiconductor element 1 mounted on the mounting substrate 2, and a cooling member 4 located on the periphery of the semiconductor element 1. In FIGS. 1 to 3 illustrating this embodiment, one semiconductor chip constituting the semiconductor element is mounted on the mounting substrate. However, the invention is not limited to the case where only one semiconductor chip is mounted on the mounting substrate, but a plurality of semiconductor chips may be mounted thereon. It is also possible to use a multichip package containing a plurality of chips.

The semiconductor substrate constituting the semiconductor element 1 is illustratively made of silicon semiconductor. Interconnects and external connection terminals formed on the mounting substrate 2 are not necessary for describing the invention, and hence not shown or described. The cooling member 4 in this embodiment is illustratively a heat radiating fin or heat pipe of copper (thermal conductivity: 398 W/mK) or aluminum (thermal conductivity: 237 W/mK). The mounting substrate has low thermal conductivity, and is illustratively made of epoxy resin impregnated glass fiber insulating plate (thermal conductivity: 0.3 W/mK). Thus, by using a combination of the high thermal conductivity member with a high thermal conductivity and the mounting substrate with a low thermal conductivity (average thermal conductivity being equal to or less than 30 W/mK), the heat from a junction between the semiconductor element and the mounting substrate can be spread to the surface or inside of the mounting substrate in a planar direction as shown by the arrows 100.

As shown in FIGS. 2A and 3, a high thermal conductivity member 3 is formed as a thin film on the mounting substrate 2. The high thermal conductivity member 3 is illustratively made of synthetic diamond. The semiconductor element 1 is attached to a prescribed position on the surface of the high thermal conductivity member 3. The cooling member 4, illustratively a heat radiating fin made of copper, is attached to the exposed surface of the high thermal conductivity member 3, outside the portion to which the semiconductor element 1 is attached. The material used for the high thermal conductivity member is not limited to synthetic diamond, but can be any material having a thermal conductivity of e.g. 100 W/mK or more such as carbon, copper, aluminum, gold, and silver. External terminals (not shown) of the semiconductor element 1 are connected to interconnects (not shown) or electrodes (not shown) of the mounting substrate 2. As shown in FIG. 2A, in this example semiconductor device of the first embodiment, the semiconductor element 1 and the cooling member 4 are located on the first surface 301 of the high thermal conductivity member 3. This construction in which the semiconductor element 1 and the cooling member 4 are located on the same surface of the high thermal conductivity member 3, can keep the thickness of the semiconductor device thin.

Next, a method for cooling the semiconductor device of this embodiment is described with reference to FIG. 1.

Heat generated in the semiconductor element 1 is propagated to the mounting substrate 2 side through pins as indicated by vertical arrows in the figure. The heat propagated to the mounting substrate 2 side is transferred directly or indirectly to the high thermal conductivity member 3 extensively formed on the surface of the mounting substrate 2, and spread on the surface of the mounting substrate 2 as indicated by horizontal arrows. This increases heat transfer area, hence allowing efficient cooling also with the help of wind flow and natural convection on the surface of the mounting substrate 2.

The high thermal conductivity member 3 is made of synthetic diamond or other material as described above. This material has good lateral thermal conductivity even in a thin film shape. Hence increase of thickness and cost can be restricted.

In this embodiment, a heat radiating fin or heat pipe is thermally connected to the high thermal conductivity member on the mounting substrate surface. Hence it is possible to achieve high cooling performance and to reduce the total height as compared to connecting a fin on the semiconductor chip. The position for attaching a fin may be all or part of the surface around the semiconductor element.

Figure 2B:
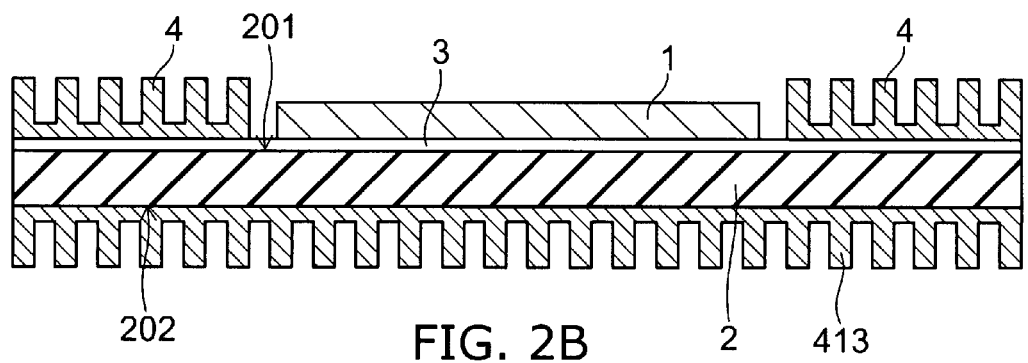
FIG. 2B is a cross-sectional view of a semiconductor device showing another example semiconductor device of the first embodiment.

FIG. 2B shows a cross-sectional view of a semiconductor device showing another example semiconductor device of the first embodiment. In this example, the mounting substrate 2 has the high thermal conductivity member 3 having the semiconductor element 1 and the cooling element 4 on the first surface 201 of the mounting substrate and the mounting substrate 3 includes the third cooling member 413 formed on the second surface 202 of the mounting substrate opposite to the first surface 201 of the mounting substrate. Cooling effect is further improved by providing the third cooling member 413.

FIG. 4 shows another example semiconductor device of this embodiment. This semiconductor device is based on a packaged semiconductor element of the BGA (ball grid array) type. As shown in FIG. 4, a high thermal conductivity member 3 is formed as a thin film on the mounting substrate 2. The semiconductor element 1 is attached to a prescribed position on the surface of the high thermal conductivity member 3. The cooling member 4 is bonded with adhesive (a first thermally conductive member) to the exposed surface of the high thermal conductivity member 3, outside the portion to which the semiconductor element 1 is attached. The adhesive may be a thermal conductive sheet, a grease, a solder, or a resin, which thermally bonds the cooling member 4 to the high thermal conductivity member 3. The cooling member 4 is thermally connected to the thermal conductive member by a thermal conductive member 511. The semiconductor element 1 comprises a package substrate 6 having external terminals 7 such as solder balls on its backside and a semiconductor substrate 8 formed on the package substrate 6, the semiconductor substrate 8 having terminals such as solder balls formed on its backside. The package substrate 6 has a multilayer interconnect structure. The terminals of the semiconductor substrate 8 are electrically connected to the interconnect on the surface of the package substrate 6, and thereby the external terminals 7 of the semiconductor element 1 are electrically connected to the integrated circuit formed within the semiconductor substrate 8. Furthermore, the semiconductor element 1 is attached to the second cooling member 412 contacting with the semiconductor substrate 8 and package substrate 6. In this example, the second cooling member 412 is a heat spreader 9 made of copper or aluminum, which covers the semiconductor substrate 8 and the package substrate 6 and is in contact with the surface thereof. The heat spreader improves spreading of generated heat as compared to the semiconductor device of FIG. 3.

Second Embodiment

Next, a second embodiment is described with reference to FIG. 5A.

This embodiment is characterized in that a plurality of high thermal conductivity members are provided inside the mounting substrate as well as on the surface thereof, and are thermally connected to each other via through holes filled with thermally conductive members.

FIG. 5A is a cross-sectional view of a semiconductor device according to this embodiment. As shown in FIG. 5A, the semiconductor device comprises a mounting substrate 22, at least one semiconductor element 21 (one, in this embodiment) mounted on the mounting substrate 22, and a cooling member 24 located on the periphery of the semiconductor element 21. The semiconductor substrate constituting the semiconductor element 21 is illustratively made of silicon semiconductor. Interconnects and external connection terminals formed on the mounting substrate 22 are not necessary for describing the invention, and hence not shown or described. The cooling member 24 in this embodiment is illustratively a heat radiating fin or heat pipe of copper or aluminum. The mounting substrate 22 is illustratively made of epoxy resin impregnated glass fiber insulating plate.

A high thermal conductivity member 23 is formed as a thin film on the surface of the mounting substrate 22. Furthermore, a high thermal conductivity member 25 is formed as a thin film also inside the mounting substrate 22. The high thermal conductivity members 23, 25 are thermally connected to each other via thermally conductive members 27 of copper embedded in through holes 26 formed in the mounting substrate 22. The high thermal conductivity members 23, 25 are illustratively made of synthetic diamond. The cooling member 24, illustratively a heat radiating fin made of copper, is attached to a prescribed position on the exposed surface of the high thermal conductivity member 23, outside the portion to which the semiconductor element 21 is attached. The material used for the high thermal conductivity member is not limited to synthetic diamond, but can be copper, aluminum, gold, or silver. The semiconductor element 21 used in this embodiment is a packaged semiconductor element of the BGA type as in FIG. 4. The semiconductor element 21 comprises a package substrate having external terminals such as solder balls on its backside and a semiconductor substrate formed on the package substrate, the semiconductor substrate having terminals such as solder balls formed on its backside. The package substrate has a multilayer interconnect structure. The terminals of the semiconductor substrate are electrically connected to the interconnect on the package substrate surface, and thereby the external terminals of the semiconductor element 21 are electrically connected to the integrated circuit formed within the semiconductor substrate. Furthermore, a heat spreader 29 is attached to the semiconductor element 21. The heat spreader 29 is made of copper or aluminum, which covers the semiconductor substrate and the package substrate and is in contact with the surface thereof.

Next, a method for cooling the semiconductor device of this embodiment is described.

Heat generated in the semiconductor element 21 is propagated to the mounting substrate 22 side through pins. The heat propagated to the mounting substrate 22 side is transferred directly or indirectly to the high thermal conductivity member 23 extensively formed on the surface of the mounting substrate 22, and spread on the surface of the mounting substrate 22. This increases heat transfer area, hence allowing efficient cooling also with the help of wind flow and natural convection on the surface of the mounting substrate 22. More specifically, heat spreading laterally in the high thermal conductivity member 23 is propagated to the cooling member 24 and cooled therein. Furthermore, heat transferred to the high thermal conductivity member 23 is transferred to the high thermal conductivity member 25 inside the mounting substrate 22 via the thermally conductive members 27 embedded in the through holes 26. The heat transferred to the high thermal conductivity member 25 is propagated to below the cooling member 24, propagated via the thermally conductive members 27 and the high thermal conductivity member 23 to the cooling member 24, and cooled therein.

The high thermal conductivity member has good lateral thermal conductivity even in a thin film shape. Hence increase of thickness and cost can be restricted.

As described above, in this embodiment, a heat radiating fin or heat pipe is thermally connected to the high thermal conductivity member on the mounting substrate surface. Hence it is possible to achieve high cooling performance and to reduce the total height as compared to connecting a fin on the semiconductor element. The position for attaching a fin may be all or part of the surface around the semiconductor element. While the cooling member is attached on the same side as the semiconductor element in FIG. 5A, the cooling member can be attached to the backside of the mounting substrate. Cooling effect is further improved by providing a plurality of high thermal conductivity members.

FIG. 5B shows a cross-sectional view of a semiconductor device showing another example semiconductor device of the second embodiment. As shown in FIG. 5B, the second high thermal conductivity member 312 is formed as a thin film also inside the mounting substrate 22. The high thermal conductivity member 23 and the second high thermal conductivity member 312 are thermally connected to each other via the second thermally conductive members 512. The second thermally conductive member 512 is made of copper embedded in through holes 26 formed in the mounting substrate 22. Furthermore, the third cooling member 413 is formed on the second surface 202 of the mounting substrate 2. The third cooling member 413 is thermally connected to the second high thermal conductivity member 312 via thermally conductive member 512. Cooling effect is further improved by providing the third cooling member 413.

Third Embodiment

Next, a third embodiment is described with reference to FIG. 6.

Figure 6:
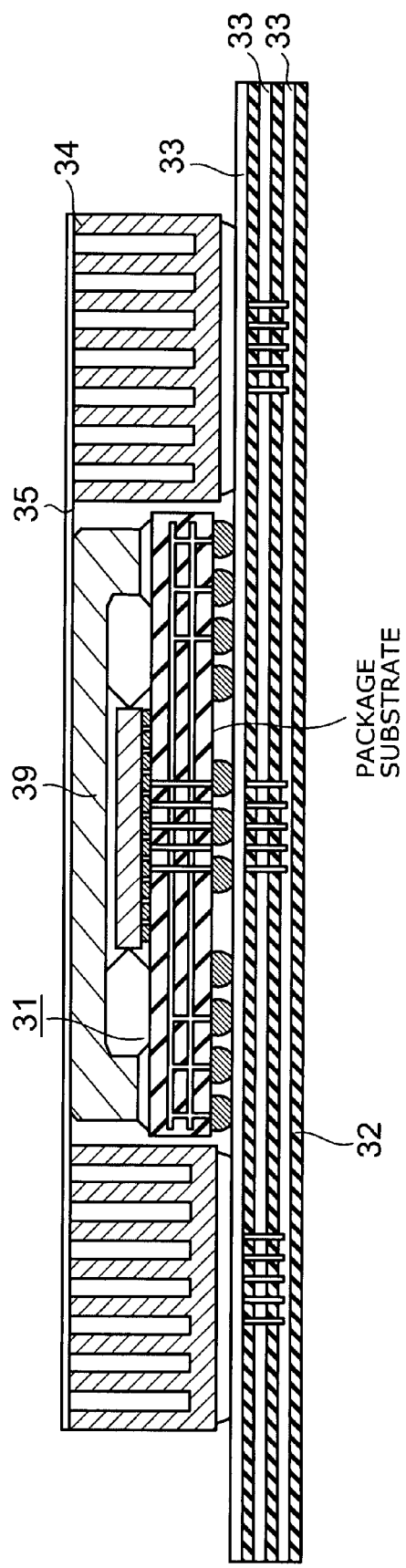
FIG. 6 is a cross-sectional view of a semiconductor device according to the third embodiment which is one of embodiments of the present invention.

FIG. 6 is a cross-sectional view of a semiconductor device according to this embodiment. As shown in FIG. 6, the semiconductor device comprises a mounting substrate 32, at least one semiconductor element 31 (one, in this embodiment) mounted on the mounting substrate 32, and a cooling member 34 located on the periphery of the semiconductor element 31. The semiconductor substrate constituting the semiconductor element 31 is illustratively made of silicon semiconductor. Interconnects and external connection terminals formed on the mounting substrate 32 are not necessary for describing the invention, and hence not shown or described. The cooling member 34 in this embodiment is illustratively a heat radiating fin or heat pipe of copper or aluminum. The mounting substrate is illustratively made of epoxy resin impregnated glass fiber insulating plate.

High thermal conductivity members 33 are formed as thin films on and inside the mounting substrate 32. These high thermal conductivity members are thermally connected to each other via through holes. The high thermal conductivity member 33 is illustratively made of synthetic diamond. The semiconductor element 31 is attached to a prescribed position on the surface of the high thermal conductivity member 33. The semiconductor element 31 used in this embodiment is a packaged semiconductor element of the BGA type as in FIG. 4. The semiconductor element 31 comprises a package substrate having external terminals such as solder balls on its backside and a semiconductor substrate formed on the package substrate, the semiconductor substrate having terminals such as solder balls formed on its backside. The package substrate has a multilayer interconnect structure. The terminals of the semiconductor substrate are electrically connected to the interconnect on the package substrate surface, and thereby the external terminals of the semiconductor element 31 are electrically connected to the integrated circuit formed within the semiconductor substrate. Furthermore, a heat spreader 39 is attached to the semiconductor element 31. The heat spreader 39 is made of copper or aluminum, which covers the semiconductor substrate and the package substrate and is in contact with the surface thereof.

The cooling member 34, illustratively a heat radiating fin made of copper, is attached to the exposed surface of the high thermal conductivity member 33, outside the portion to which the semiconductor element 31 is attached. Furthermore, in this embodiment, a thermally conductive metal plate 35 of aluminum is bonded with adhesive and thermally connected onto the heat spreader 39 and the cooling member 34 that are thermally connected to the semiconductor element 31. The material used for the high thermal conductivity member is not limited to synthetic diamond, but can be copper, aluminum, gold, and silver. External terminals of the semiconductor element 31 are connected to interconnects (not shown) or electrodes (not shown) of the mounting substrate 32.

Next, a method for cooling the semiconductor device of this embodiment is described.

Heat generated in the semiconductor element 31 is propagated to the mounting substrate 32 side. The heat propagated to the mounting substrate 32 side is transferred directly or indirectly to the high thermal conductivity member 33 extensively formed on the surface of the mounting substrate 32, and spread on the surface of the mounting substrate 32. This increases heat transfer area, hence allowing efficient cooling also with the help of wind flow and natural convection on the surface of the mounting substrate 32.

The high thermal conductivity member 33 is made of synthetic diamond or other material as described above. This material has good lateral thermal conductivity even in a thin film shape. Hence increase of thickness and cost can be restricted.

In this embodiment, a heat radiating fin or heat pipe is thermally connected to the high thermal conductivity member on the mounting substrate surface, and the thermally conductive metal plate connected to the heat spreader on the semiconductor element surface is brought into contact with the cooling member, allowing heat to be transferred from both the upper and lower face of the semiconductor element to the cooling member. Hence it is possible to achieve high cooling performance and to reduce the total height as compared to connecting a fin on the semiconductor element. The position for attaching a fin may be all or part of the surface around the semiconductor element.

Fourth Embodiment

Next, a fourth embodiment is described with reference to FIG. 7.

Figure 7:
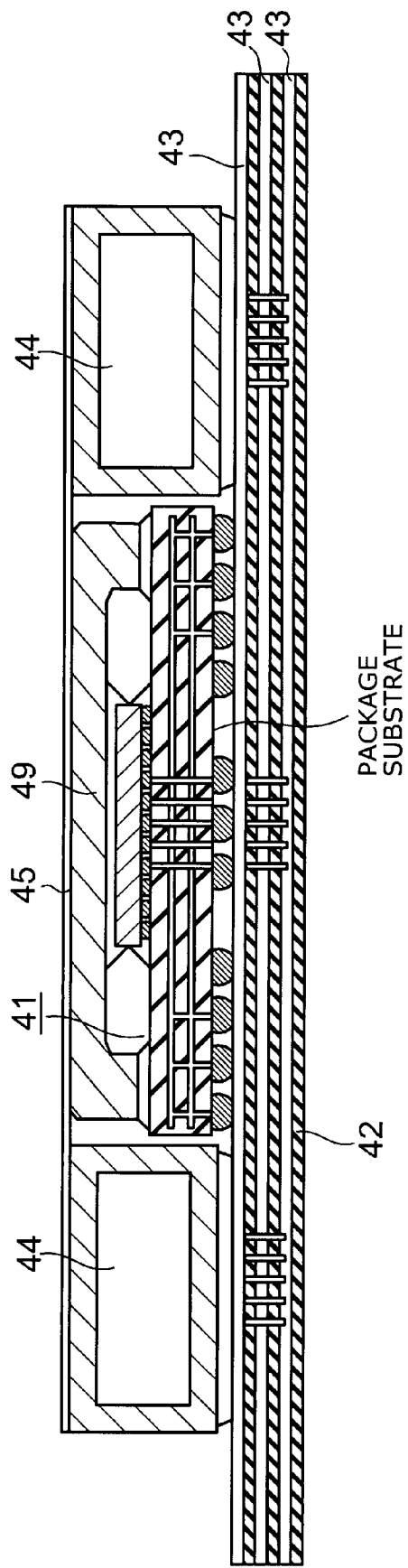
FIG. 7 is a cross-sectional view of a semiconductor device according to the fourth embodiment which is one of embodiments of the present invention.

FIG. 7 is a cross-sectional view of a semiconductor device according to this embodiment. As shown in FIG. 7, the semiconductor device comprises a mounting substrate 42, at least one semiconductor element 41 (one, in this embodiment) mounted on the mounting substrate 42, and a cooling member 44 located on the periphery of the semiconductor element 41. The semiconductor substrate constituting the semiconductor element 41 is illustratively made of silicon semiconductor. Interconnects and external connection terminals formed on the mounting substrate 42 are not necessary for describing the invention, and hence not shown or described. The cooling member 44 in this embodiment is illustratively a coolant channel. Coolant is passed through the channel to enhance cooling effect. The mounting substrate is illustratively made of epoxy resin impregnated glass fiber insulating plate.

A high thermal conductivity member 43 is formed as a thin film on the mounting substrate 42. The high thermal conductivity member 43 is illustratively made of synthetic diamond. The semiconductor element 41 is attached to a prescribed position on the surface of the high thermal conductivity member 43. The semiconductor element 41 used in this embodiment is a packaged semiconductor element of the BGA type as in FIG. 4. The semiconductor element 41 comprises a package substrate having external terminals such as solder balls on its backside and a semiconductor substrate formed on the package substrate, the semiconductor substrate having terminals such as solder balls formed on its backside. The package substrate has a multilayer interconnect structure. The terminals of the semiconductor substrate are electrically connected to the interconnect on the package substrate surface, and thereby the external terminals of the semiconductor element 41 are electrically connected to the integrated circuit formed within the semiconductor substrate. Furthermore, a heat spreader 49 is attached to the semiconductor element 41. The heat spreader 49 is made of copper or aluminum, which covers the semiconductor substrate and the package substrate and is in contact with the surface thereof. The cooling member 44 made of the cooling channel is attached to the exposed surface of the high thermal conductivity member 43, outside the portion to which the semiconductor element 41 is attached.

Furthermore, in this embodiment, a thermally conductive metal plate 45 of aluminum is bonded with adhesive and thermally connected onto the heat spreader 49 and the cooling member 44 that are thermally connected to the semiconductor element 41. The material used for the high thermal conductivity member is not limited to synthetic diamond, but can be copper, aluminum, gold, and silver. External terminals of the semiconductor element 41 are connected to interconnects (not shown) or electrodes (not shown) of the mounting substrate 42.

Next, a method for cooling the semiconductor device of this embodiment is described.

Heat generated in the semiconductor element 41 is propagated to the mounting substrate 42 side. The heat propagated to the mounting substrate 42 side is transferred directly or indirectly to the high thermal conductivity member 43 extensively formed on the surface of the mounting substrate 42, and spread on the surface of the mounting substrate 42. This increases heat transfer area, hence allowing efficient cooling also with the help of wind flow and natural convection on the surface of the mounting substrate 42.

The high thermal conductivity member 43 is made of synthetic diamond or other material as described above. This material has good lateral thermal conductivity even in a thin film shape. Hence increase of thickness and cost can be restricted.

In this embodiment, a coolant channel (heat receiving jacket for water cooling) is thermally connected to the high thermal conductivity member on the mounting substrate surface, and the thermally conductive metal plate on the semiconductor element surface is brought into contact with the cooling member, allowing heat to be transferred from both the upper and lower face of the semiconductor element to the cooling member. Hence it is possible to achieve high cooling performance and to reduce the total height as compared to connecting a fin on the semiconductor element.

According to the invention, sufficient cooling can be performed by using a cooling member such as a fin or heat pipe even without sufficient space in the height direction of the semiconductor element above the high thermal conductivity member. Hence the invention is suitable to thin electronic devices, mobile phones, personal computers, and game machines.

The invention claimed is:

1. A semiconductor device comprising:
   a mounting substrate;
   a first high thermal conductivity member formed over a surface of the mounting substrate;
   a semiconductor element mounted over a first region of a surface of the first high thermal conductivity member; and
   a cooling member mounted over a second region except for the first region of the surface of the first high thermal conductivity member,
   wherein heat is spread from a junction between the semiconductor element and the first high thermal conductivity member through the first high thermal conductivity member in a planar direction to the cooling member.

2. The semiconductor device according to claim 1, wherein the mounting substrate includes a plurality of layers of second high thermal conductivity members, and through holes filled with thermally conductive members thermally connected to the second high thermal conductivity members for transferring heat in the substrate thickness direction, the thermally conductive member in the through hole thermally connecting between the layers of the second high thermal conductivity members.

3. The semiconductor device according to claim 1, wherein a portion of the cooling member is thermally connected to an upper face of the semiconductor element.

4. The semiconductor device according to claim 1, wherein the high thermal conductivity member is made of material selected from the group consisting of synthetic diamond, copper, Au, Ag, and Al.

5. The semiconductor device according to claim 1, wherein
   the first high thermal conductive member, the semiconductor element and the cooling member are provided over a first surface of the mounting substrate,
   an additional cooling member is provided over a second surface of the mounting substrate opposite to the first surface,
   the mounting substrate includes a plurality of layers of second high thermal conductivity members, and through holes filled with thermally conductive members thermally connected to the second high thermal conductivity members configured to transfer heat in the substrate thickness direction, the thermally conductive member in the through hole thermally connecting the layers of the second high thermal conductivity members, and
   a portion of the additional cooling member is thermally connected to the second thermally conductive members.

6. A semiconductor device comprising:
   a mounting substrate;
   a first high thermal conductivity member formed over a surface of the mounting substrate;
   a semiconductor element mounted over a first region of a surface of the first high thermal conductivity member; and
   a first cooling member mounted over a second region except for the first region of the surface of the first high thermal conductivity member.

7. The semiconductor device according to claim 6, wherein the first high thermal conductivity member spreads heat from a junction between the semiconductor element and the first high thermal conductivity member through the first high thermal conductivity member in a planar direction.

8. The semiconductor device according to claim 6, wherein the first high thermal conductivity member has a thermal conductivity equal to or greater than 100 W/mK.

9. The semiconductor device according to claim 6, wherein the mounting substrate has an average thermal conductivity equal to or smaller than 30 W/mK.

10. The semiconductor device according to claim 6, wherein the first high thermal conductivity member is made of a material selected from the group consisting of carbon, synthetic diamond, Cu, Au, Ag, and Al.

11. The semiconductor device according to claim 6, further comprising a first thermally conductive member located between the first high thermal conductivity member and the first cooling member, and the first thermally conductive member thermally connecting the first high thermal conductivity member and the first cooling member.

12. The semiconductor device according to claim 6, wherein a second high thermal conductive member is provided inside the mounting substrate.

13. The semiconductor device according to claim 6, wherein a second high thermal conductive member is provided inside the mounting substrate and the second high thermal conductivity member is thermally connected to the first high thermal conductivity member by a second thermally conductive member.

14. The semiconductor device according to claim 6, wherein a plurality of layers of second high thermal conductive members are formed inside the mounting substrate, and the layers of the second high thermal conductive members are thermally connected to each other by a second thermally conductive member.

15. The semiconductor device according to claim 6, wherein a part of the high thermal conductivity member or a part of the thermal conductive member is exposed on the surface of the mounting substrate.

16. The semiconductor device according to claim 6, wherein the semiconductor device includes a second cooling member thermally connected to the semiconductor element.

17. The semiconductor device according to claim 6, wherein a portion of the second cooling member is thermally connected to an upper surface of the semiconductor element.

18. The semiconductor device according to claim 6, wherein the semiconductor element and the first cooling member are located on the first surface of the first high thermal conductivity member.

19. The semiconductor device according to claim 6, wherein
   the first high thermal conductivity member, the semiconductor element and the first cooling element are provided over a first surface of the mounting substrate, and
   the mounting substrate includes a third cooling member located on a second surface of the mounting substrate which is opposite to the first surface of the mounting substrate.

20. The semiconductor device according to claim 6, wherein
   the first high thermal conductivity member, the semiconductor element and the first cooling element are provided over a first surface of the mounting substrate,
   the mounting substrate includes a third cooling member located on a second surface of the mounting substrate which is opposite to the first surface of the mounting substrate, a second high thermal conductive member is formed inside the mounting substrate, the second high thermal conductive member being thermally connected to the first high thermal conductivity member by a second thermally conductive member, and a third cooling member is connected to a part of the second thermally conductive member.

21. The semiconductor device according to claim 6, wherein the first high thermal conductivity member is thermally connected to the semiconductor element, and has an outer edge which is located outside an outer edge of the semiconductor element.

* * * * *